(12) United States Patent
Kumano

(10) Patent No.: US 8,692,315 B2
(45) Date of Patent: Apr. 8, 2014

(54) SEMICONDUCTOR DEVICE AND FABRICATION METHOD THEREOF

(75) Inventor: Hiroshi Kumano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 135 days.

(21) Appl. No.: 13/403,313

(22) Filed: Feb. 23, 2012

(65) Prior Publication Data

US 2012/0217574 A1     Aug. 30, 2012

(30) Foreign Application Priority Data

Feb. 24, 2011   (JP) .................................. 2011-38592

(51) Int. Cl.
*H01L 27/088*  (2006.01)
*H01L 21/336*  (2006.01)

(52) U.S. Cl.
USPC .............. 257/327; 257/E27.06; 257/E21.409; 438/151

(58) Field of Classification Search
USPC .............. 257/327, E27.06, E21.409; 438/151
See application file for complete search history.

(56) References Cited

FOREIGN PATENT DOCUMENTS

| JP | 2006-332133 A | 12/2006 |
|---|---|---|
| JP | 2009-054828 A | 3/2009 |

*Primary Examiner* — Jarrett Stark
*Assistant Examiner* — Lawrence Tynes, Jr.
(74) *Attorney, Agent, or Firm* — Rabin & Berdo, P.C.

(57) ABSTRACT

A semiconductor device includes a semiconductor substrate having an active layer in which an element region and a contact region are formed, a support substrate supporting the active layer, and a buried insulation layer interposed between the active layer and the support substrate. A transistor element is formed in the element region, the transistor element having a transistor buried impurity layer formed within the active layer. The semiconductor device further includes a substrate contact having a contact buried impurity layer formed within the contact region and a through contact extending from the surface of the active layer to the support substrate through the contact buried impurity and the buried insulation layer, the contact buried impurity layer being in the same layer as the transistor buried impurity layer.

34 Claims, 9 Drawing Sheets

SEMICONDUCTOR DEVICE AND FABRICATION METHOD THEREOF

CROSS-REFERENCE TO RELATED APPLICATIONS

This application is based upon and claims the benefit of priority from Japanese Patent Application No. 2011-38592, filed on Feb. 24, 2011, the entire contents of which are incorporated herein by reference.

TECHNICAL FIELD

The present disclosure relates to a semiconductor device including a semiconductor substrate in which an active layer and a support substrate are electrically insulated by a buried insulation layer, and a fabrication method thereof.

BACKGROUND

Recently, a technique for extracting a potential of a support substrate of an SOI substrate from a surface of the SOI substrate has been proposed.

One example of a semiconductor device includes a semiconductor substrate, a buried insulation film made of $SiO_2$ and formed on the semiconductor substrate, a semiconductor film made of Si and formed on the buried insulation film, a trench isolation surrounding a partial region of the semiconductor film, and a substrate potential contact formed within a region surrounded by the trench isolation and connected to the semiconductor substrate through the semiconductor film and the buried insulation film.

Another example of a semiconductor device includes an SOI (Silicon On Insulator) substrate, on which an n type silicon support substrate, a BOX (Buried Oxide) layer made of $SiO_2$, and an n type silicon SOI layer are stacked in this order, a trench isolation partitioning a substrate potential contact region, a substrate potential contact formed in the substrate potential contact region and connected to the support substrate through the SOI layer and the BOX layer, and an n type well formed in an upper portion of the SOI layer within the substrate potential contact region.

SUMMARY

The present disclosure provides some embodiments of a semiconductor device, including a semiconductor substrate in which an active layer and a support substrate are electrically insulated by a buried insulation layer, capable of reducing resistance of a substrate contact for extracting a potential of the support substrate from a surface of the active layer, and a fabrication method thereof.

According to one embodiment of the present disclosure, there is provided a semiconductor device including a semiconductor substrate including an active layer having a first conductive type in which an element region and a contact region are formed, a support substrate having a second conductive type and supporting the active layer, and a buried insulation layer interposed between the active layer and the support substrate to electrically insulate the active layer and the support substrate, a transistor element formed in the element region, the transistor element including a transistor buried impurity layer formed within the active layer and being spaced apart from a surface of the active layer, and a substrate contact including a contact buried impurity layer formed within the contact region and a through contact extending from the surface of the active layer to the support substrate through the contact buried impurity and the buried insulation layer, the contact buried impurity layer corresponding to the same layer as the transistor buried impurity layer.

With this configuration, the support substrate and the active layer may be electrically connected by the through contact of the substrate contact. Accordingly, a potential of the support substrate may be fixed and a current may flow from the surface of the active layer to the support substrate. Further, like the through contact, the contact buried impurity layer formed around the through contact and having resistance lower than that of other portions of the active layer may also contribute to an electrical connection between the support substrate and the active layer. As a result, a sectional area in a direction along the surface of the active layer in a conductive path (substrate contact) between the support substrate and the active layer may be increased. Thus, resistance of the conductive path may be lowered.

In addition, the contact buried impurity layer is formed as the same layer as the transistor buried impurity layer of the transistor element formed in the same semiconductor substrate. This "layer formed as the same layer" refer to a relationship between layers which are fabricated simultaneously in the same process, and for example, it refers to a relationship between a first impurity layer and a second impurity layer in the fabrication method according to the present disclosure.

According to another embodiment of the present disclosure, there is provided a method for fabricating a semiconductor device, the method preparing a semiconductor substrate including an active layer with a first conductive type in which an element region and a contact region are formed, a support substrate with a second conductive type supporting the active layer, and a buried insulation layer interposed between the active layer and the support substrate to electrically insulate the active layer and the support substrate, selectively implanting an impurity into the element region and the contact region from a surface of the active layer to simultaneously form a first impurity layer exposed from a surface of the element region and a second impurity layer exposed from a surface of the contact region, epitaxially growing the active layer to raise the height of the surface of the active layer with respect to the buried insulation layer to form the first impurity layer as a transistor buried impurity layer spaced apart from the raised surface, and to simultaneously form the second impurity layer as a contact buried impurity layer spaced apart from the raised surface, forming a transistor element having the transistor buried impurity layer in the element region, and forming a trench extending from the surface of the active layer to the support substrate through the contact buried impurity and the buried insulation layer and embedding a through contact in contact with both of the active layer and the support substrate within the trench to form a substrate contact having the contact buried impurity layer and the through contact in the contact region.

That is, the contact buried impurity layer formed from the second impurity layer is the same layer as the transistor-buried impurity layer formed from the first impurity layer, and these layers are simultaneously formed by implanting impurities from the surface of the active layer and then epitaxially growing the active layer.

With this method, the region of the contact buried impurity layer along the surface of the active layer may be simply enlarged by increasing the area in which impurities are implanted. On this account, when comparing to the convention method,) in which an impurity region is formed in an SOI layer by implanting dopant to the side of a hole for a substrate potential contact, the sectional area of the contact buried impurity layer may be increased. As a result, resistance of the substrate contact may be further lowered.

Further, as mentioned above, the contact buried impurity layer is formed through "the impurity implantation into the active layer" and "the epitaxial growth of the active layer".

On this account, after the formation of the substrate contact, a process of forming a field insulation film on the surface of the active layer and a process of forming an opening having a width smaller than that of the contact buried impurity layer along the surface of the active layer on the field insulation film by removing a portion of the field insulation film in the contact region are performed, whereby the width of the contact buried impurity layer along the surface of the active layer is greater than that of the opening of the field insulation film.

In one embodiment, the transistor element further includes a transistor exposing impurity layer formed on the transistor buried impurity layer and forming a portion of the surface of the active layer, and the substrate contact further includes a contact exposing impurity layer formed as the same layer of that of the transistor exposing impurity layer and disposed to be in contact with the through contact.

With this configuration, in the active layer, a portion that may be used as a conductive path between the support substrate and the active layer may be increased, and thus, the resistance of the substrate contact may be further lowered.

This configuration may be implemented by performing a process of forming wherein said forming a transistor element further comprises forming a transistor exposing impurity layer to form a first portion of the surface of the active layer on the transistor buried impurity layer by selectively implanting a first impurity into the element region from the surface of the active layer once the transistor buried impurity layer is formed, and wherein said forming a substrate contact further comprises forming a contact exposing impurity layer to form a second portion of the surface of the active layer on the contact buried impurity layer by selectively implanting a second impurity into the contact region simultaneously when implanting the first impurity into the element region, in the process of forming a substrate contact.

With this method, an implementation depth of impurities into the active layer in forming the contact exposing impurity layer is designed in corresponding to an amount of an epitaxial growth of the active layer in forming the contact buried impurity layer to thereby individually control the contact exposing impurity layer. Thus, the impurity concentration of each of the contact buried impurity layer and the contact exposing impurity layer may be precisely controlled based on the characteristics of the substrate contact to be obtained. As a result, it is possible to precisely control a resistance value of each of the contact buried impurity layer and the contact exposing impurity layer which varies according to an increase and decrease of the impurity concentration.

Further, since the impurity layer (contact buried impurity layer) close to the buried insulation layer is formed through an epitaxial growth and the impurity layer (contact exposing impurity layer) close to the surface of the active layer is formed through an impurity implantation on the surface thereof, the impurity layers may be formed thoroughly in a thickness direction (vertical direction) of the active layer. Thus, even when the through contact is formed to have a high aspect ratio, the overall through contact may be surrounded by the impurity layers. As a result, a large current may be allowed to flow to the support substrate, and thus the present disclosure may be applicable to a vertical type device.

In one embodiment, the transistor element includes a complementary metal oxide semiconductor (CMOS) transistor comprised of first and second transistors, the first transistor includes a CMOS buried layer as the transistor buried impurity layer having the same conductivity type (e.g., n type) as that of the active layer, the second transistor includes a CMOS isolation layer as the transistor buried impurity layer having the opposite conductivity type (e.g., p type) to that of the active layer, and the contact buried impurity layer is formed as the same layer as the CMOS buried layer and/or the CMOS isolation layer.

That is, in implementing the low resistance substrate contact, a layer formed as the same layer as the CMOS buried layer and/or the CMOS isolation layer of the CMOS transistor may be used.

This configuration may be implemented by performing a process of forming a CMOS buried layer as the transistor buried impurity layer having the same conductivity type as the first conductivity type of the active layer, and forming a CMOS isolation layer having an opposite conductivity type to the first conductivity type of the active layer, and wherein said forming a transistor element comprises forming a CMOS transistor including a first transistor having the CMOS buried layer and a second transistor having the CMOS isolation layer, and said forming a contact buried impurity layer is simultaneously performed with at least one of said forming a CMOS buried layer and said forming a CMOS isolation layer, and the process of forming a contact buried impurity layer.

In one embodiment, the first transistor includes a first well layer as the transistor exposing impurity layer having the same conductivity type as that of the active layer and disposed to be in contact with the surface of the CMOS buried layer, and a first source layer and a first drain layer as the transistor exposing impurity layer having an opposite conductivity type to that of the active layer and formed to be spaced apart from each other in a surface layer portion of the first well layer, the second transistor includes a second well layer as the transistor exposing impurity layer having an opposite conductivity type to that of the active layer and disposed to be in contact with the surface of the CMOS isolation layer, and a second source layer and a second drain layer as the transistor exposing impurity layer having the same conductivity type as that of the active layer and formed to be spaced apart from each other in a surface layer portion of the second well layer, and the contact exposing impurity layer is formed as the same layer as any one of the first well layer, the second well layer, the first source layer, the first drain layer, the second source layer, and the second drain layer.

That is, in implementing the low resistance substrate contact, a layer formed as the same layer as any one of the first well layer, the second well layer, the first source layer, the first drain layer, the second source layer, and the second drain layer of the CMOS transistor may be used.

This configuration may be implemented by performing a process of forming a first well layer as the transistor exposing impurity layer having the same conductivity type as the first conductivity type of the active layer to be in contact with the CMOS buried layer, forming a first source layer and a first drain layer having an opposite conductivity type to that of the active layer to be spaced apart from each other in a surface layer portion of the first well layer, forming a second well layer having an opposite conductivity type to the first conductivity type of the active layer to be in contact with the surface of the CMOS isolation layer, and forming a second source layer and a second drain layer having the same conductivity type as the first conductivity type of the active layer to be spaced apart from each other in a surface layer portion of the second well layer, and wherein said forming a contact exposing impurity layer is simultaneously performed with at least one of said forming a first well layer, said forming a second well layer, said forming a first source layer, said forming a first drain layer, said forming a second source layer, and said forming a second drain layer, and the process of forming a contact exposing impurity layer.

In one embodiment, the transistor element includes a bipolar transistor and the bipolar transistor includes a collector layer as the transistor buried impurity layer having the same conductivity type as the first conductivity type of the active layer, and the contact buried impurity layer is formed as the same layer as the collector layer.

That is, in implementing the low resistance substrate contact, a layer formed as the same layer as the collector layer of the bipolar transistor may be used.

This configuration may be implemented by performing a process of forming a collector layer as the transistor buried impurity layer having the same conductivity type as that of the active layer and then performing a process of forming a bipolar transistor having the collector layer, and simultaneously performing the process of forming a collector layer and the process of a contact buried impurity layer.

In one embodiment, the bipolar transistor includes base layer as the transistor exposing impurity layer having the opposite conductivity type to the first conductivity type of the active layer and formed to be spaced apart from the collector layer; and an emitter layer as the transistor exposing impurity layer having the same conductivity type as the first conductivity type of the active layer and formed in a surface layer portion of the base layer, and the contact exposing impurity layer is formed as the same layer as at least one of the base layer and the emitter layer.

That is, in implementing the low resistance substrate contact, a layer formed as the same layer as the base layer and/or the emitter layer of the bipolar transistor may be used.

This configuration may be implemented by performing a process of forming a base layer as the transistor exposing impurity layer having an opposite conductivity type to that of the active layer to form a space between the base layer and the collector layer, and a process of forming an emitter layer having the same conductivity type as that of the active layer in a surface layer portion of the base layer, and simultaneously performing the process of forming a base layer and/or the process of forming an emitter layer, and the process of forming a contact exposing impurity layer.

In one embodiment, the bipolar transistor further includes a sinker layer as the transistor exposing impurity layer, and the sinker layer has the same conductivity type to the first conductivity type of the active layer and extends from the surface of the active layer to reach the collector layer, and the contact exposing impurity layer includes a layer formed as the same layer as the sinker layer.

That is, in implementing the low resistance substrate contact, a layer formed as the same layer as the sinker layer of the bipolar transistor may be used.

This configuration can be implemented by performing a process of forming a sinker layer as the transistor exposing impurity layer having the same conductivity layer as the first conductivity type of the active layer, and the sinker layer extends from the surface of the active layer to reach the collector layer, and said forming a contact exposing impurity layer simultaneously performed with said forming a sinker layer.

In one embodiment, the element region is demarcated by an element isolating portion, and the element isolating portion is formed to have an annular shape surrounding the transistor element and insulates the element region from other portions of the active layer.

In one embodiment, the element isolating portion includes a first annular deep trench extending from the surface of the active layer to reach the buried insulation layer, a first insulation film formed on an inner wall of the first deep trench, and a first semiconductor layer charged in the first deep trench.

Further, the contact region may be installed within or outside the element region. When the semiconductor device further includes an interlayer insulation film formed on the semiconductor substrate and an electrode pad formed on the interlayer insulation film, the substrate contact may be installed under the electrode pad.

In this manner, the contact region may be disposed at various portions on the active layer. Further, like the element region, the contact region is demarcated by a contact isolating portion formed to have an annular shape surrounding the substrate contact, and thus, the contact region can be electrically insulated from other portions of the active layer. In this case, no matter how the contact region is disposed, the contact region can be independent from other portions of the active layer, so the potential of the support substrate can be freely controlled.

In addition, the contact isolating portion preferably includes a second annular deep trench extending from the surface of the active layer to reach the buried insulation layer, a second insulation film formed on an inner wall of the second deep trench, and a second semiconductor layer charged in the second deep trench. It is preferred that the element isolating portion and the contact isolating portion are simultaneously formed after the formation of the trench reaching the support substrate. For example, the element isolating portion and the contact isolating portion may be simultaneously formed by performing a process forming annular deep trenches extending from the surface of the active layer to reach the buried insulation layer to surround each of the element region and the contact region, a process of forming an insulation film on an inner wall of each of the deep trenches, and a process of charging a semiconductor layer within each of the deep trenches.

In one embodiment, in forming the through contact, the process of forming a trench may include a process of forming a half trench extending from the surface of the active layer to the buried insulation layer through dry etching, and a process of removing the buried insulation layer forming a bottom wall of the half trench through wet etching.

Even when the trench is formed by the combination of dry etching and wet etching, when the element isolating portion and the contact isolating portion are formed after the formation of the trench of the substrate contact as mentioned above, an etching medium that is used for wet etching can be prevented from being in contact with the insulation film formed on the inner wall of the deep trench. Thus, a change in the property of the insulation film by the etching medium can be prevented.

In one embodiment, the first conductivity type and the second conductivity type may be the same conductivity type, or may be different conductivity types. That is, it may be any of a first type (active layer: n type, support substrate: n type), a second type (active layer: p type, support substrate: p type), a third type (active layer: n type, support substrate: p type), and a fourth type (active layer: p type, support substrate: n type).

In one embodiment, the substrate contact may include a lower implanted layer formed at a connection portion of the through contact in the support substrate. In this case, the lower implanted layer may have the same conductivity type as that of the support substrate or may have the opposite conductivity type to that of the support substrate.

When the lower implanted layer has a low conductivity type opposite to that of the support substrate, a pn junction is formed between the substrate contact (lower implanted layer) and the support substrate, so the junction may be used as a GND diode, or the like.

When the lower implanted layer is formed on the support substrate, for example, after the trench reaching the support substrate is formed, an impurity is implanted into the bottom wall of the trench before the through contact is embedded, thereby performing the process of forming the lower implanted layer on the support substrate. Alternatively, impurity concentration of the support substrate may be increased in advance such that it can serve as a lower implanted layer, or, before fabricating a semiconductor substrate, an impurity may be implanted into certain portions of the support substrate to form a lower implanted layer and then buried in the support substrate to form an insulation layer and an active layer. In the latter case, specifically, for example, when the following SOI substrate is used as a semiconductor substrate, the lower implanted layer may be formed in the silicon substrate by impurity implantation before the silicon substrate and the silicon active layer are attached to each other.

In one embodiment, the semiconductor substrate may include an SOI substrate in which the active layer and the support substrate are made of silicon (Si) and the buried insulation layer is made of silicon oxide ($SiO_2$). In this case, preferably, the through contact is made of polysilicon (Poly-Si).

With this configuration, a junction between the support substrate and the through contact may be a junction of silicons (i.e., junction between homogeneous materials). As a result, thermal expansion coefficient of the through contact can be similar to that of the support substrate. Thus, the through contact and the support substrate can be thermally expanded and thermally contracted to almost equal extent. Accordingly, an occurrence of a phenomenon in which only one of the members is thermally expanded or thermally contracted and the other is damaged can be prevented. Further, electro migration or ion migration may be suppressed. Moreover, the through contact can be prevented from being contaminated by heavy metal. As a result, the semiconductor device having excellent reliability may be provided.

DETAILED DESCRIPTION

Figure 1:
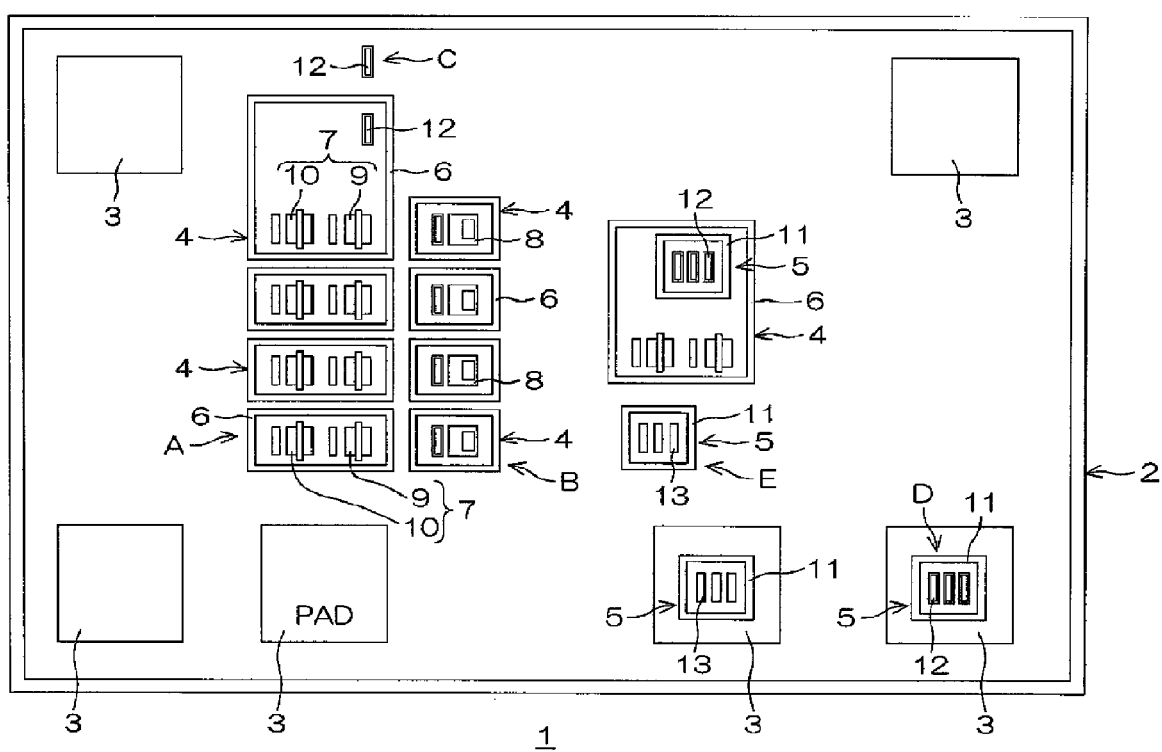
FIG. 1 is a layout view of a semiconductor device according to an embodiment of the present disclosure.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram forms in order to facilitate describing one or more embodiments.

FIG. 1 is a layout view of a semiconductor device according to an embodiment of the present disclosure.

A semiconductor device 1 includes thick silicon on an insulator (SOI) substrate 2 as a semiconductor substrate. The SOI substrate has a rectangular shape when viewed from the plane (i.e., the plane of the thick SOI substrate 2). A plurality of electrode pads 3, a plurality of element regions 4, and a plurality of contact regions 5 are formed on a surface of the thick SOI substrate 2.

In FIG. 1, the electrode pads 3 are disposed along the periphery of the semiconductor device 1, and the element regions 4 are disposed at a central portion of the semiconductor device 1. Each of the element regions 4 is demarcated by an element isolating portion 6 having a rectangular annular shape when viewed from the plane, and a complementary metal oxide semiconductor (CMOS) transistor 7 or a bipolar transistor 8 is formed as a transistor element within each element isolating portion 6. Each of CMOS transistors 7 and each of bipolar transistors 8 are surrounded by the element isolating portion 6. Further, each of the CMOS transistors 7 includes a p type metal oxide semiconductor field effect transistor (MOSFET) 9 as a first transistor and an n type MOSFET 10 as a second transistor. In this embodiment, the bipolar transistor 8 is an npn bipolar transistor 8.

Some of contact regions 5 are demarcated by a contact isolating portion 11 having a rectangular annular shape when viewed from the plane, and substrate contacts (an n type substrate contact 12 as a first substrate contact and a p type substrate contact 13 as a second substrate contact) are formed within each of the contact isolating portions 11. The contact region 5 may be disposed within the element region 4 as an internal contact region. Otherwise, the contact region 5 may be disposed outside the element region 4 as an external contact region. Further, some of the contact regions 5 outside the element region 4 are disposed immediately below the electrode pad 3 such that it overlaps with the electrode pad 3 when viewed from the plane. Meanwhile, the other remaining contact regions 5 other than the contact regions 5 demarcated by the contact isolating portion 11 are not demarcated by the boundary of the contact isolating portion 11, and may be formed, for example, by using a portion of the element region 4 or a portion other than the element region 4 on the SOI substrate.

Figure 2A:
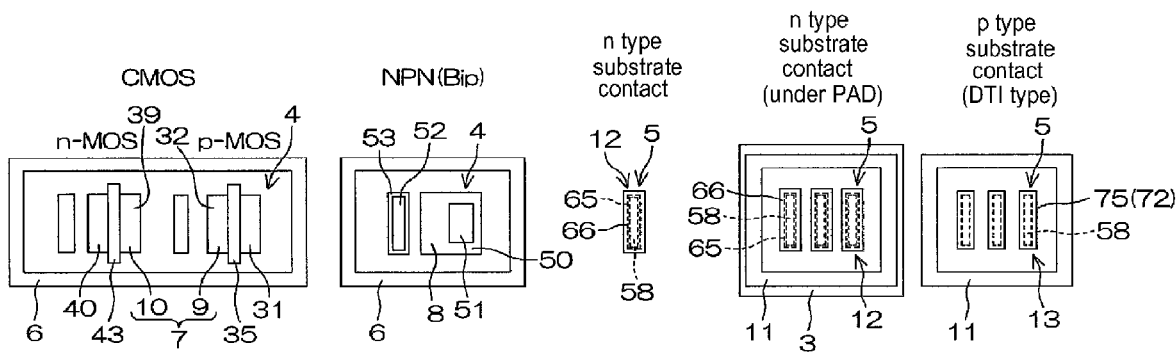
FIG. 2A is a schematic diagram of some portions of the semiconductor device shown in FIG. 1.

FIG. 2A is a schematic diagram of some portions of the semiconductor device shown in FIG. 1. In particular, FIG. 2A shows the CMOS transistor 7, the npn bipolar transistor 8, the n type substrate contact 12, the n type substrate contact 12 arranged under the pad 3, and the p type substrate contact 13 indicated by arrows A to E in FIG. 1, respectively. The n type substrate contact 12 is referred to as "n type substrate contact under pad" in FIG. 2A, where the n type substrate contact 12 is disposed under the pad 3 and isolated by a deep trench isolation (DTI). Further, the p type substrate contact 13 is isolated by the DTI in FIG. 2A.

Figure 2B:
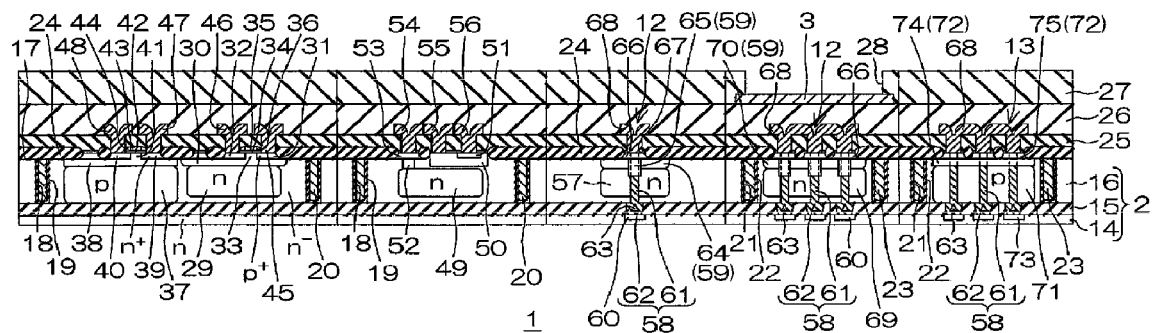
FIG. 2B is a schematic side-sectional view of the portions shown in FIG. 2A.

FIG. 2B is a schematic side-sectional view of the portions shown in FIG. 2A.

Referring to FIG. 2B, an internal configuration of the CMOS transistor 7, the npn bipolar transistor 8, the n type substrate contact 12, the n type substrate contact 12 under the pad 3 and the p type substrate contact 13 is described below.

The CMOS transistor 7 and the like are formed on the thick SOI substrate 2. The thick SOI substrate 2 includes an active layer 16 made of n⁻ type silicon (Si) is stacked on an n type Si substrate 14 as a support substrate, and a buried oxide (BOX) layer 15 made of $SiO_2$ as a buried insulation layer. The active layer 16 and the Si substrate 14 are electrically insulated by the BOX layer 15 interposed therebetween.

The thickness of the BOX layer 15 ranges, for example, from 0.5 µm to 5 µm, and the thickness of the active layer 16 ranges, for example, from 8 µm to 30 µm. Further, the thickness of the Si substrate 14 is determined by a polishing process corresponding to a required final specification. In addition, the impurity concentration of the n⁻ type active layer 16 ranges, for example, from $1\times10^{14}$ cm$^{-3}$ to $2\times10^{15}$ cm$^{-3}$.

The element isolating portion 6 for demarcating the element region 4 of the CMOS transistor 7 and the npn bipolar transistor 8 is formed by a first annular deep trench 18 extending from a surface 17 of the active layer 16 to a surface of the BOX layer 15, a first trench thin film 19 as a first insulation film formed on an inner wall (side wall and bottom wall) of the first deep trench 18, and a first polysilicon layer 20 as a first semiconductor layer charged in the first deep trench 18 to fill the interior of the first trench thin film 19.

The contact isolating portion 11 for demarcating the contact regions 5 of the n type substrate contact 12 (which has a DTI type and is disposed under the pad 3 and the p type substrate contact 13 (DTI type) is formed by a second annular deep trench 21 extending from the surface 17 of the active layer 16 to the surface of the BOX layer 15, a second trench thin film 22 as a second insulation film formed on the inner wall (side wall and bottom wall) of the second deep trench 21, and a second polysilicon layer 23 as a second semiconductor layer charged in the second deep trench 21 to fill the interior of the second trench thin film 22. In this embodiment, the first and second deep trenches 18 and 21 have the same depth.

Accordingly, each of the element regions 4 and some of the contact regions 5 (only the contact regions 5 of the n type substrate contact 12 under the pad 3 and the p type substrate contact 13) are surrounded by the first or second deep trench 18 or 21. Further, each of these regions has an island shape and the BOX layer 15 and the first or second trench thin film 19 or 22 completely isolates each of these regions to insulate from the surrounding portions thereof. That is, each of these regions is completely dielectrically separated.

Further, a field insulation film 24 made of SiO$_2$, a first interlayer insulation film 25 made of SiO$_2$, a second interlayer insulation film 26, and a surface protective film 27 made of SiN are sequentially stacked on the surface 17 of the active layer 16. The field insulation film 24 has a thickness, for example, ranging from 0.5 µm to 1.0 µm, the first interlayer insulation film 25 has a thickness, for example, ranging from 0.5 µm to 1.0 µm, and the second interlayer insulation film 26 has a thickness, for example, ranging from 1.0 µm to 2.0 µm. In addition, the electrode pad 3 is formed on the second interlayer insulation film 26. A pad opening 28 is formed in the surface protective film 27 to expose a portion of the electrode pad 3.

<CMOS Transistor 7>

As described above, the complementary metal oxide semiconductor (CMOS) transistor 7 has the p type MOSFET 9 of a p type channel, and the n type MOSFET 10 of an n type channel.

The p type MOSFET 9 has an n type buried layer (B/L) 29 as a CMOS-buried layer, an n type well 30 as a first well layer, a p⁺ type drain layer 31 as a first drain layer, and a p⁺ type source layer 32 as a first source layer.

The B/L 29 is a layer buried in the active layer 16 to provide a space between the BOX layer 15 and the surface 17 of the active layer 16. The thickness of the B/L 29 ranges, for example, from 3 µm to 9 µm, however, it may be appropriately changed according to a fabrication method. Further, an impurity concentration of the n type B/L 29 ranges, for example, from $1\times10^{15}$ cm$^{-3}$ to $1\times10^{16}$ cm$^{-3}$.

The n type well 30 is formed to be in contact with an upper surface of the B/L 29, and an upper portion thereof forms a portion of the surface 17 of the active layer 16. The thickness (depth) of the n type well 30 is within the range of, for example, 2.0 µm to 3.0 µm. Further, an impurity concentration of the n type well 30 is within the range of, for example, $1\times10^{16}$ cm$^{-3}$ to $5\times10^{16}$ cm$^{-3}$.

The p⁺ type source layer 3 and the p⁺ type drain layer 31 are formed to be spaced apart from each other along the surface 17 of the active layer 16 on a surface layer portion of the n type well 30.

In the p type MOSFET 9, a portion of the n type well 30 between the p⁺ type source layer 32 and the p⁺ type drain layer 31 corresponds to a p type channel region 33.

Further, an impurity concentration of the p⁺ type source layer 32 and that of the p⁺ type drain layer 31 are set to be as high as possible.

A gate insulation film 34 is formed on the p type channel region 33, and a gate electrode 35 is formed on the gate insulation film 34. Further, a side wall 36 is formed around the gate insulation film 34 and the gate electrode 35.

The n type MOSFET 10 includes a p type lower isolation (L/I) layer 37 as a CMOS buried layer, a p type well 38 as a second well layer, an n⁺ type drain layer 39 as a second drain layer and an n⁺ type source layer 40 as a second source layer.

The L/I layer 37 is in contact with the BOX layer 15 and buried within the active layer 16 to form a space between the L/I layer 37 and the surface 17 of the active layer 16. The thickness of the L/I layer 37 ranges, for example, from 5 µm to 15 µm, which is greater than that of the B/L 29. Further, an impurity concentration of the p type L/I layer 37 is within the range, for example, of $1\times10^{15}$ cm$^{-3}$ to $1\times10^{17}$ cm$^{-3}$.

The p type well 38 is formed to be in contact with an upper surface of the L/I layer 37, and an upper portion thereof forms a portion of the surface 17 of the active layer 16. The thickness (depth) of the p type well 38 is within the range, for example, of 1.5 µm to 2.5 µm. Further, an impurity concentration of the p type well 38 is within the range of, for example, $5\times10^{15}$ cm$^{-3}$ to $1\times10^{17}$ cm$^{-3}$.

The n⁺ type source layer 40 and the n⁺ type drain layer 39 are formed to be spaced apart from each other along the surface 17 of the active layer 16 on a surface layer portion of the p type well 38.

In the n type MOSFET 10, a portion of the p type well 38 between the n⁺ type source layer 40 and the n⁺ type drain layer 39 corresponds to an n type channel region 41. Further, an impurity concentration of the n⁺ type source layer 40 and that of the n⁺ type drain layer 39 are set to be as high as possible.

A gate insulation film 42 is formed on the n type channel region 41, and a gate electrode 43 is formed on the gate insulation film 42. Further, a side wall 44 is formed around the gate insulation film 42 and the gate electrode 43.

In the element region 4 in which the CMOS transistor 7 is formed, a p type source wiring 46, a p type drain wiring 45, an n type source wiring 48, and an n type drain wiring 47 are formed on the first interlayer insulation film 25. These wirings 45 to 48 are connected to the p⁺ type source layer 32, the p⁺ type drain layer 31, the n⁺ type source layer 40, and the n⁺ type drain layer 39, respectively, through the first interlayer insulation film 25 and the field insulation film 24.

<npn Bipolar Transistor 89>

The npn bipolar transistor 8 has an n type collector layer 49 as a transistor buried layer, a p type base layer 50 as a transistor exposing impurity layer, an n⁺ type emitter layer 51, and an n type sinker layer 52.

The collector layer 49 is a layer buried within the active layer 16 to provide a space between the BOX layer 15 and the surface 17 of the active layer 16. The thickness of the collector layer 49 ranges, for example, from 3 μm to 9 μm, which equals to that of the B/L 29. Further, an impurity concentration of the n type collector layer 49 is within the range of, for example, $1\times10^{15}$ cm$^{-3}$ to $1\times10^{16}$ cm$^{-3}$.

The base layer 50 may be a layer formed above the collector layer 49 such that a space is formed between the base layer 50 and the collector layer 49, and an upper portion of the base layer 50 forms a portion of the surface 17 of the active layer 16. The thickness (depth) of the base layer 50 is within the range of, for example, 1.5 μm to 2.5 μm, which equals to that of the p type well 38. Further, an impurity concentration of the p type base layer 50 is within the range of, for example, $5\times10^{15}$ cm$^{-3}$ to $1\times10^{17}$ cm$^{-3}$.

The sinker layer 52 is formed to be adjacent to the base layer 50 along the surface 17 of the active layer 16 and to provide a space between the sinker layer 52 and the base layer 50. The sinker layer 52 is connected to an upper portion of the collector layer 49 from the surface of the active layer 16. Further, an upper portion of the n type sinker layer 52 is an n$^|$ type sinker contact region 53 having an impurity concentration higher than that of the other portions.

The thickness (depth) of the sinker layer 52 is within range of, for example, 3.0 μm to 5.0 μm. Further, an impurity concentration of a portion other than the sinker contact region 53 of the n type sinker layer 52 is within the range of, for example, $1\times10^{18}$ cm$^{-3}$ to $5\times10^{19}$ cm$^{-3}$.

The thickness (depth) of the n$^+$ type sinker contact region 53 is equal to that of the n$^+$ type source layer 40 and the n$^+$ type drain layer 39. Further, an impurity concentration of the n$^+$ type sinker contact region 53 is set to be as high as possible.

The emitter layer 51 is formed to have a well shape in a surface layer portion of the base layer 50. The emitter layer 51 is disposed closer to an end portion of the base layer 50 which is farther from the sinker layer 52 than the other end portion of the base layer 50, which is close to the sinker layer 52. The emitter layer 51 forms a portion of the surface 17 of the active layer 16. In this embodiment, the thickness (depth) of the emitter layer 51 is equal to that of the sinker contact region 53.

In the element region 4 in which the npn bipolar transistor 8 is formed, a collector wiring 54, a base wiring 55, and an emitter wiring 56 are formed on the first interlayer insulation film 25. These wirings 54 to 56 are connected to the sinker layer 52 (or the sinker contact region 53), the base layer 50, and the emitter layer 51, respectively, through the first interlayer insulation film 25 and the field insulation film 24. The collector wiring 54 connected to the sinker contact region 53 is electrically connected to the collector layer 49, by having the sinker layer 52 interposed therebetween.

<n Type Substrate Contact 12>

The n type substrate contact 12 makes ohmic contact with the n type Si substrate 14, through a portion which has the same conductive type (e.g., n type) as that of the Si substrate 14. The n type substrate contact 12 has an n type contact buried layer 57 as a contact buried impurity layer, a through contact 58, an n type contact exposing layer 59 as a contact exposing impurity layer, and an n$^+$ type lower implanted layer 60.

Figure 3A:
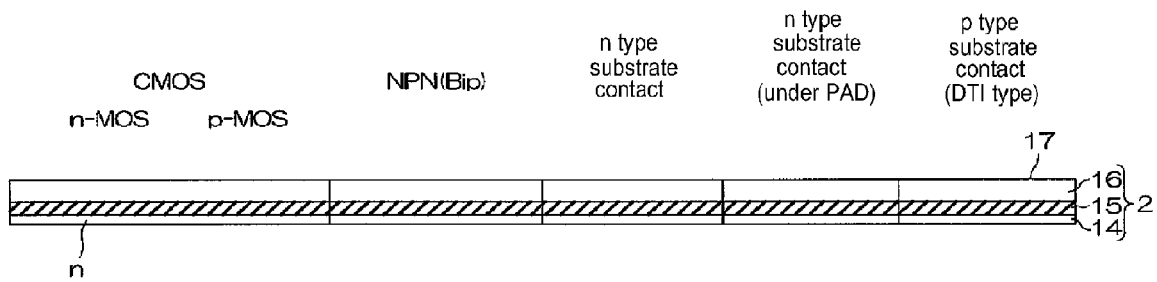
FIGS. 3A-3N illustrate schematic sectional views of a fabrication method of the semiconductor device shown in FIG. 2, in sequence.

The n type contact buried layer 57 is formed as the same layer as the B/L 29 and the collector layer 49. Here, as shown in FIGS. 3A to 3N, the "layer formed as the same layer" refers to a relationship of layers simultaneously fabricated through the same process. That is, the n type contact buried layer 57 is simultaneously fabricated through the same process as that of the B/L 29 and the collector layer 49.

Thus, the thickness (depth) of the n type contact buried layer 57 is equal to that of the B/L 29 and the collector layer 49.

The through contact 58 is made of an n type impurity-doped polysilicon, and has a rectangular columnar shape when viewed from the plane. The through contact 58 extends from the surface 17 of the active layer 16 to the Si substrate 14 through the active layer 16 and the BOX layer 15. Specifically, the through contact 58 having a columnar shape includes a contact main body 61 penetrating the active layer 16 and a contact lower portion 62 connected to the Si substrate 14 through the BOX layer 15. The contact lower portion 62 is formed to have a width wider than that of the contact main body 61. The contact lower portion 62 includes a thin and long void 63 extending in a length direction of the through contact 58. In the present disclosure, the length direction follows a longer side of the through contact 58. Meanwhile, the void 63 may not be included depending on the fabrication condition of the semiconductor device 1.

The n type contact buried layer 57 surrounds the contact main body 61 to be in contact with the circumference of the main body of the through contact 58. The n type contact buried layer 57 surrounding the contact main body 61 may be of any size regardless of the shape of the contact main body 61 when viewed from the plane. On the other hand, a planar size of the contact main body 61 is limited by the depth and aspect ratio of the through contact 58. However, a shorter side of the contact main body 61 is, for example, within the range of 1 μm to 4 μm, and a longer side size thereof is not limited. Further, an impurity concentration of the n type through contact 58 may be freely selected by doping impurities into the polysilicon.

The n type contact exposing layer 59 includes an n type annular contact well 64 surrounding the contact main body 61 to be in contact with the circumference of an upper portion of the contact main body 61, which is an end portion close to the active layer 16, and an n type contact extraction portion 65 formed to mingle with an upper portion of the corresponding contact main body 61 in the surface layer portion of the active layer 16, and to extract the potential of the Si substrate 14.

Here, the description that the "n type contact extraction portion 65 and the upper portion of the contact main body 61 mingle" refers that both the active layer 16 and the contact main body 61 are made of silicon (Si), such as polysilicon (Poly-Si), and, when the n type contact extraction portion 65 is formed by implanting impurities into the active layer 16, an impurity concentration of the upper portion of the contact main body 61 is defined to be equal to an impurity concentration of the n type contact extraction portion 65 so that the contact main body 61 is integrated with the upper portion of the n type contact extraction portion 65.

The n type annular contact well 64 is a layer formed as the same layer as the n type well 30. Thus, the thickness of the n type annular contact well 64 is equal to that of the n type well 30.

Further, the n type contact extraction portion 65 is formed as the same layer as the sinker layer 52. Similar to the sinker layer 52, the upper portion of the n type contact extraction portion 65 is formed as an n$^|$ type potential extraction contact region 66 having an impurity concentration higher than that of the other remaining portions.

The thickness (depth) of the n type contact extraction portion 65 is within the range of, for example, 3.0 μm to 5.0 μm, which equals to that of the sinker layer 52.

In addition, the thickness (depth) of the n$^+$ type potential extraction contact region 66 is equal to that of the n$^+$ type source layer 40, of the n$^+$ type drain layer 39, and of the sinker contact region 53. Further, the impurity concentration of the n+ type potential extraction contact region 66 is set to be as high as possible.

The n+ type lower implanted layer 60 is formed in the surface layer portion of the Si substrate 14 and is connected to the contact lower portion 62 of the through contact 58. Further, the impurity concentration of the n+ type lower implanted layer 60 is set to be as high as possible. Since the lower implanted layer (n+ type) of the n type substrate contact 12 has the same conductivity type as that of the Si substrate 14 (n type), it makes an ohmic contact with the Si substrate 14.

In the contact region 5 in which the n type substrate contact 12 is formed, an opening 67 for exposing the n type contact extraction portion 65 is formed in the field insulation film 24. The opening 67 is formed such that the width of the opening 67 that follows the surface 17 of the active layer 16 is smaller than the width of the n type contact buried layer 57 that follows the same direction.

In addition, a contact wiring 68 is formed on the first interlayer insulation film 25. The contact wiring 68 penetrates the first interlayer insulation film 25 and is connected to the n type contact extraction portion 65 (n+ type potential extraction contact region 66) with the opening 67 of the field insulation film 24 interposed therebetween. Accordingly, the potential of the Si substrate 14 can be extracted at the surface 17 of the active layer 16 through the n+ type lower implanted layer 60, the through contact 58, and the contact wiring 68.

<n Type Substrate Contact 12 (Which has the DTI Type and is Disposed Under the Pad 3)>

In this section, the same reference numerals as those of the corresponding respective parts are used for the parts corresponding to respective parts of the foregoing n type substrate contact 12. Further, hereinafter, a detailed description of the parts for which the same reference numerals are used will be omitted.

Immediately under the electrode pad 3, the contact region 5 demarcated by the contact isolating portion 11 is formed, and a plurality of (three in FIGS. 2A and 2B) n type substrate contacts 12 are installed within the contact region 5.

The plurality of n type substrate contacts 12 are disposed to be spaced apart from each other. The BOX layer 15 is placed between the through contacts 58 of the n type substrate contacts 12. The interval between the through contacts 58 and the n type substrate contacts 12 has a width depending on the thickness of the BOX layer 15. Specifically, an interval of two or more folds of the thickness of the BOX layer 15 may be placed between the through contacts 58. If the interval is narrower, for example, when the BOX layer 15 is removed through wet etching (see FIG. 3E). The wet etching is a process of removing a portion of the active layer 16 disposed between the neighboring n type substrate contacts 12 (trenches 80), which is likely to be etched (side-etched) by an etching solution. Meanwhile, in the process as illustrated in FIG. 3E, when the BOX layer 15 is dry-etched, the interval may be less than two folds of the thickness of the BOX layer 15.

An n type contact buried layer 69 is formed to come between the respective mutually neighboring through contacts 58 to collectively surround the plurality of through contacts 58. Further, like the n type contact buried layer 69, an n type annular contact well 70 of the n type contact exposing layer 59 is also formed to come between the respective mutually neighboring through contacts 58 to collectively surround the plurality of through contacts 58. The n type contact buried layer 69 and the n type annular contact well 70 are commonly used by the plurality of n type substrate contacts 12. Further, similarly, the contact wiring 68 is also commonly used by the plurality of n type substrate contacts 12.

Meanwhile, the n type contact extraction portion 65 of the n type contact exposing layer 59 is installed in each of the n type substrate contacts 12. Each of n type contact extraction portions 65 may be electrically connected to the electrode pad 3 through a hole formed in the second interlayer insulation film 26 immediately under the electrode pad 3.

<p Type Substrate Contact 13 (DTI type)>

In this section, the same reference numerals as those of the corresponding respective parts are used for the parts corresponding to respective parts of the foregoing n type substrate contact 12. Further, hereinafter, a detailed description of the parts for which the same reference numerals are used will be omitted.

The contact region 5 (DTI type) is demarcated by the contact isolating portion 11, and a plurality of (three in FIGS. 2A and 2B) p type substrate contacts 13 are installed within the contact region 5.

The plurality of p type substrate contacts 13 are disposed to be spaced apart from each other. The BOX layer 15 is placed between the through contacts 58 of the p type substrate contacts 13. The interval between the through contacts 58 and the p type substrate contacts 13 has a width depending on the thickness of the BOX layer 15. Specifically, an interval of two or more folds of the thickness of the BOX layer 15 may be placed between the through contacts 58.

Each of the p type substrate contacts 13 forms a pn junction with the n type Si substrate 14, through a portion having a different conductivity type (p type) from the Si substrate 14. Further, the p type substrate contact 13 includes a p type contact buried layer 71 as a contact buried impurity layer, the through contact 58, a p type contact exposing layer 72 as a contact exposing impurity layer, and a p+ lower implanted layer 73. The configuration of the through contact 58 is the same as that of the foregoing n type substrate contact 12.

The p type contact buried layer 71 is formed as the same layer as the L/I layer 37. Thus, the thickness of the p type contact buried layer 71 is equal to that of the L/I layer 37. The p type contact buried layer 71 is formed to come between the respective mutually neighboring through contacts 58 to collectively surround the plurality of through contacts 58.

The p type contact exposing layer 72 includes a p type annular contact well 74 surrounding the contact main body 61 to be in contact with the circumference of an upper portion of the contact main body 61, which is an end portion closer to the active layer 16, and a p+ type contact extraction portion 75 formed to mingle with the upper portion of the corresponding contact main body 61 in the surface layer portion of the active layer 16. The p type annular contact well 74 surrounding the contact main body 61 also extracts the potential of the Si substrate 14.

In addition, the p type annular contact well 74 is formed to be the same layer as the p type well 38. Thus, the thickness (depth) of the p type annular contact well 74 is equal to that of the p type well 38. Further, like the p type contact buried layer 71, the p type annular contact well 74 is also formed to come between the respective mutually neighboring through contacts 58 to collectively surround the plurality of through contacts 58. The p type contact buried layer 71 and the p type annular contact well 74 are commonly used by the plurality of p type substrate contacts 13.

Also, the p+ type contact extraction unit 75 is formed as the same layer as the p+ type source layer 32 and the p+ type drain layer 31. The thickness (depth) of the p+ type contact extraction portion 75 is equal to that of the p+ type source layer 32 and the p⁺ type drain layer 31. Further, the impurity concentration of the p⁺ type contact extraction portion 75 is set to be as high as possible.

The p⁺ type lower implanted layer 73 is formed in the surface layer portion of the Si substrate 14 and connected to a connection portion of the through contact 58. Further, the impurity concentration of the p⁺ type lower implanted layer 73 is set to be as high as possible. The lower implanted layer (p⁺ type) of the p type substrate contact 13 (DTI type) has a different conductivity type from that of the Si substrate 14 (n type) to form a pn junction with the Si substrate 14. Meanwhile, when the Si substrate 14 has a p type, the p type substrate contact 13 makes an ohmic-contact with the p type Si substrate 14.

FIGS. 3A to 3N illustrates schematic sectional views of the fabrication method of the semiconductor device illustrated in FIGS. 2A and 2B in sequence.

In order to fabricate the foregoing semiconductor device 1, for example, as shown in FIG. 3A, the thick SOI substrate 2 is prepared. The thickness of the active layer 16 of the thick SOI substrate 2 is within the range of, for example, 8 μm to 30 μm.

Figure 3B:
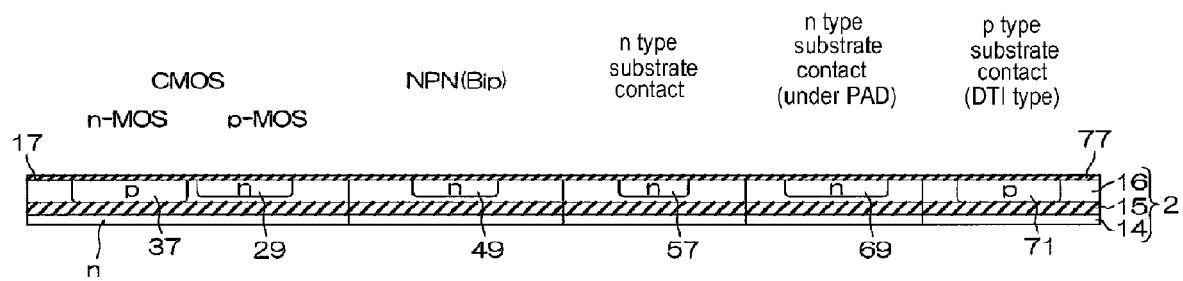

Next, as shown in FIG. 3B, after a protective film 77 made of SiO₂ is formed on the surface 17 of the active layer 16, an n type impurity, e.g., arsenic (As) is selectively implanted in the element region 4 and the contact region 5. Subsequently, a p type impurity, e.g., boron (B) is selectively implanted. On the other hand, the implantation order of the n type impurity and the p type impurity may be interchanged. Thereafter, the SOI substrate is thermally treated at, for example, 1100 to 1200 degrees C. to allow the n type impurity and the p type impurity to spread to the surface layer portion of the active layer 16. Accordingly, the L/I layer 37, the B/L 29, and the collector layer 49 as first impurity layers, and the n type contact buried layers 57 and 69 and the p type contact buried layer 71 as second impurity layers are simultaneously formed. The protective film 77 is then removed.

Figure 3C:
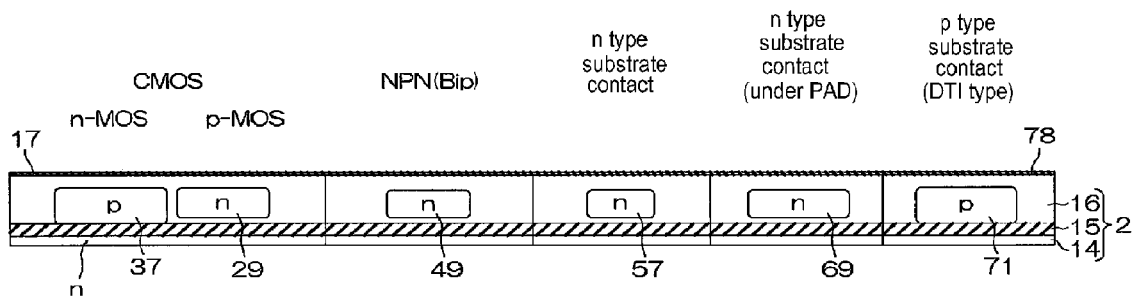

Next, as shown in FIG. 3C, the active layer 16 is epitaxially grown to elevate the entire surface 17 of the active layer 16. The increased thickness is set, for example, according to required performance of the npn bipolar transistor 8. Consequently, the L/I layer 37, the n type contact buried layers 57 and 69, or the like formed through the process of FIG. 3B are formed as buried layers spaced apart from the surface 17 of the active layer 16. Thereafter, an insulating mask 78 is formed on the surface 17 of the active layer 16.

Figure 3D:
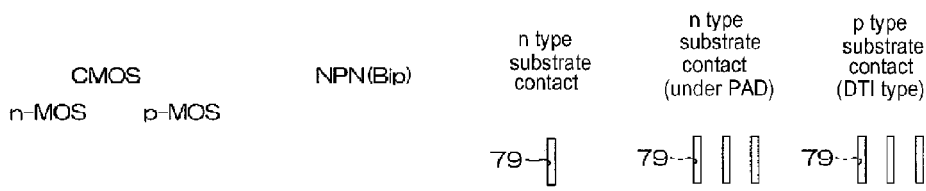
Figure 3D:
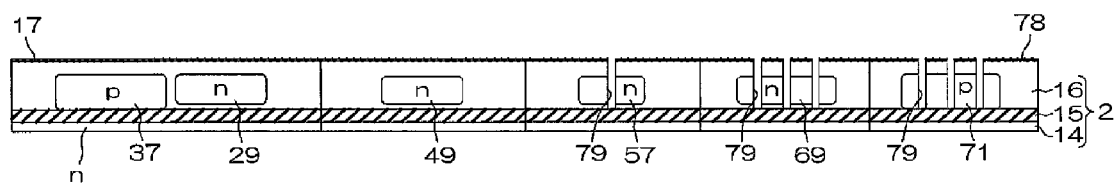
Figure 3E:
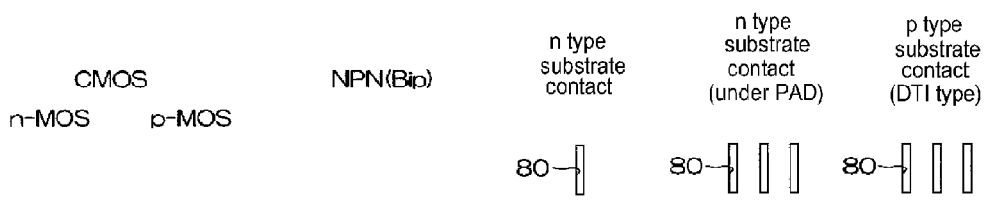
Figure 3E:
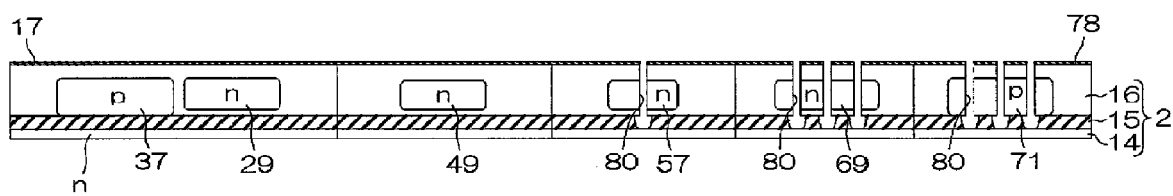

Next, as shown in FIG. 3D, the insulating mask 78 is patterned through a conventional photo lithographic technology to form openings (e.g., 8 μm length×2 μm width) at regions in which the respective through contacts 58 of the n type substrate contact 12 and the p type substrate contact 13 are to be formed. Subsequently, a plurality of half trenches 79 are simultaneously formed from the surface 17 of the active layer 16 through the n type contact buried layers 57 and 69, and the p type contact buried layer 71 to reach the BOX layer 15, by a reactive ion etching (RIE) using the insulating mask 78.

Next, as shown in FIG. 3E, a wet etching process is performed with the remained insulating mask 78. The wet etching process removes the BOX layer 15 forming a bottom wall of the half trenches 79.

Next, an etching solution that may be used for the wet etching process is spread in a thickness direction of the BOX layer 15 and also in a direction perpendicular to the thickness direction of the BOX layer 15. Accordingly, trenches 80 with a lower portion having a wide width are formed.

Figure 3F:
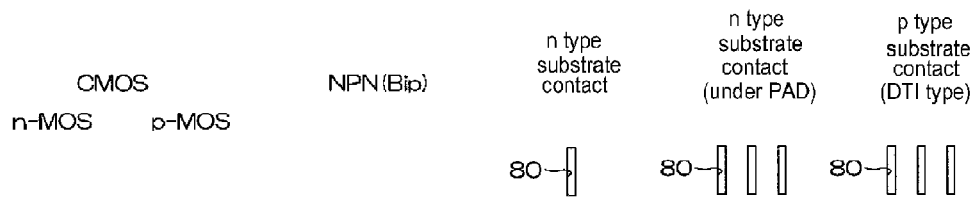
Figure 3F:
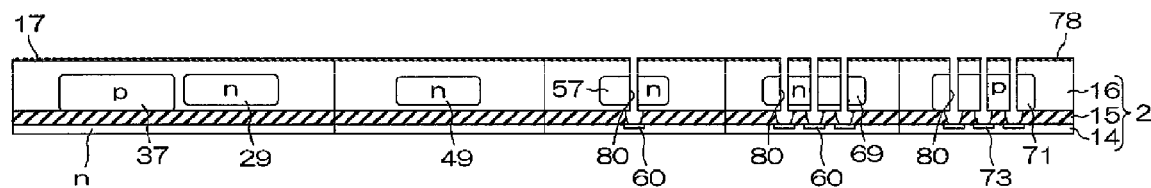

Next, as shown in FIG. 3F, an n type impurity, e.g., arsenic (As) is selectively implanted into the trenches 80 to form the n⁺ type lower implanted layer 60. Subsequently, a p type impurity, e.g., boron (B) is selectively implanted to form the p⁺ type lower implanted layer 73. In addition, the implantation order of the n type impurity and the p type impurity may be interchanged. Accordingly, the n⁺ type lower implanted layer 60 and the p⁺ type lower implanted layer 73 are formed.

Figure 3G:
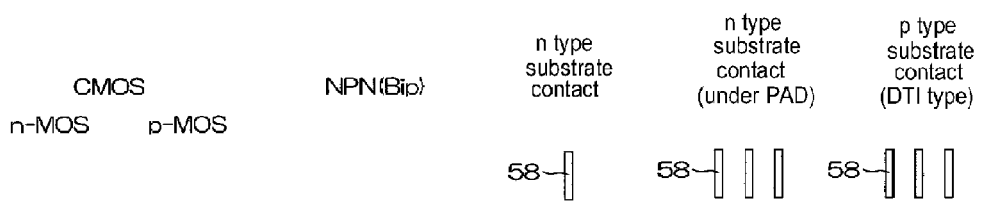
Figure 3G:
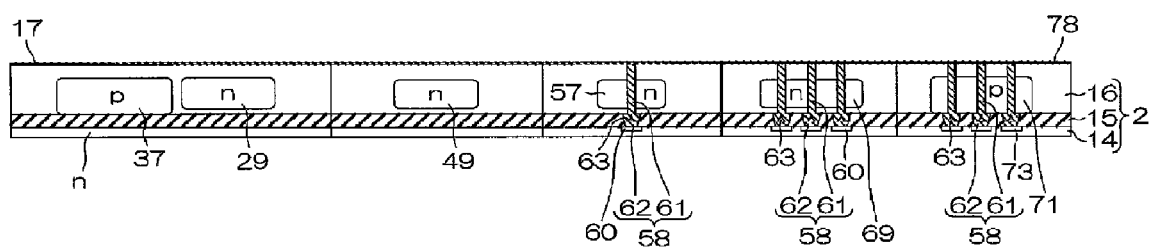

Next, as shown in FIG. 3G, polysilicon is embedded in each of the trenches 80, while adding an n type impurity through a thermal CVD method. Accordingly, the through contact 58 in which the void 63 is formed in the contact lower portion 62 is formed. After the formation of the through contact 58, the insulating mask 78 is removed.

Figure 3H:
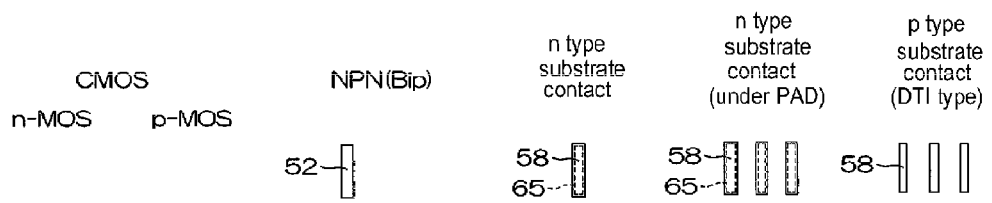
Figure 3H:
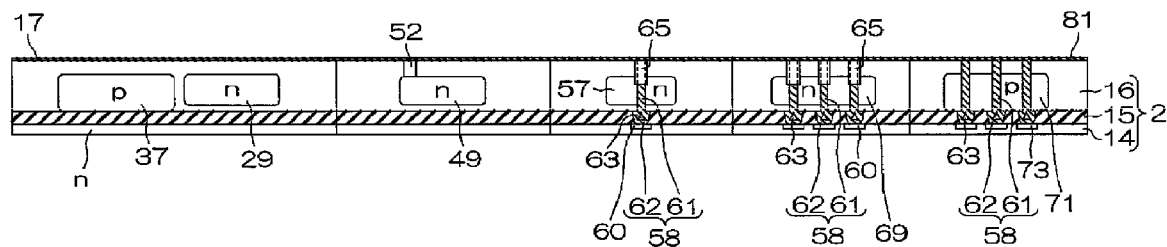

Next, as shown in FIG. 3H, a protective film 81 made of SiO₂ is formed on the surface 17 of the active layer 16 to cover the through contact 58, and then, an n type impurity, e.g., arsenic (As) is selectively implanted into the element region 4 and the contact region 5. Subsequently, the SOI substrate 2 is thermally treated at, for example, 1000 to 1100 degrees C. to allow the n type impurity to spread to the surface layer portion of the active layer 16. Accordingly, the sinker layer 52 and the n type contact extraction portion 65 of the npn transistor are simultaneously formed.

Figure 3I:
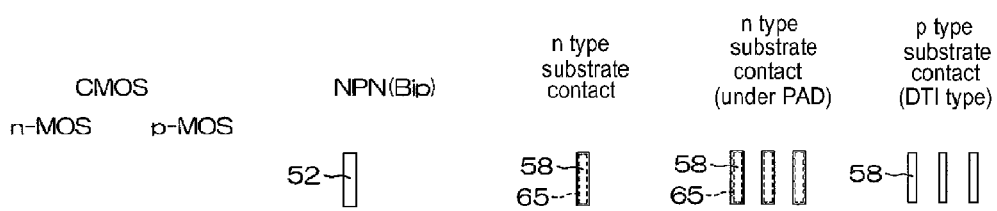
Figure 3I:
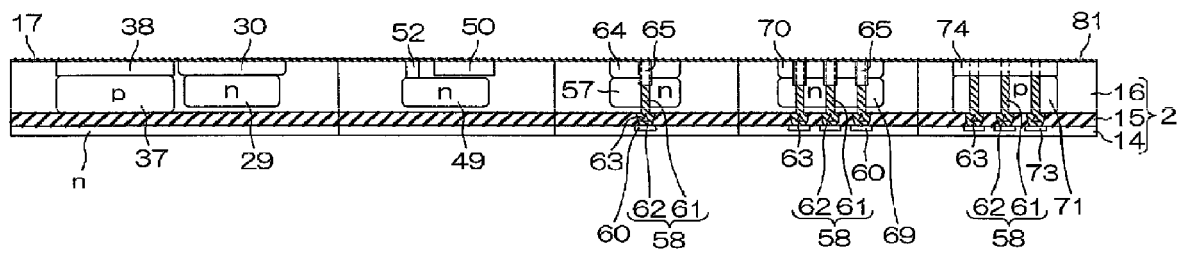

Next, as shown in FIG. 3I, an n type impurity, e.g., arsenic (As) is selectively implanted into the element region 4 and the contact region 5. Subsequently, a p type impurity, e.g., boron (B) is selectively implanted. In addition, the implantation order of the n type impurity and the p type impurity may be interchanged. Thereafter, the SOI substrate is thermally treated at, for example, 1000 to 1100 degrees C. to allow the n type impurity and the p type impurity to spread to the surface layer portion of the active layer 16. Accordingly, the p type well 38, the n type well 30, the base layer 50, the n type annular contact wells 64 and 70, and the p type annular contact well 74 are simultaneously formed.

Figure 3J:
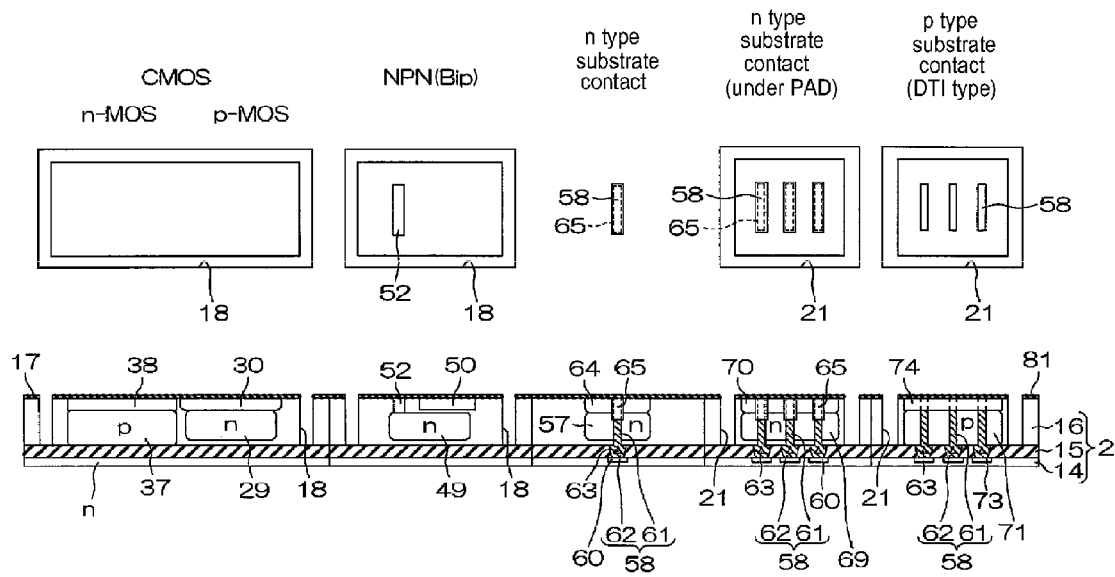

Next, as shown in FIG. 3J, the protective film 81 is patterned through a conventional photo lithographic technology to form openings at regions in which the first deep trench 18 and the second deep trench 21 are to be formed. Subsequently, the first deep trench 18 and the second deep trench 21 are simultaneously formed from the surface 17 of the active layer 16 to the BOX layer 15 through the active layer 16 by RIE using the protective film 81 as a mask. Thereafter, the protective film 81 is removed.

Figure 3K:
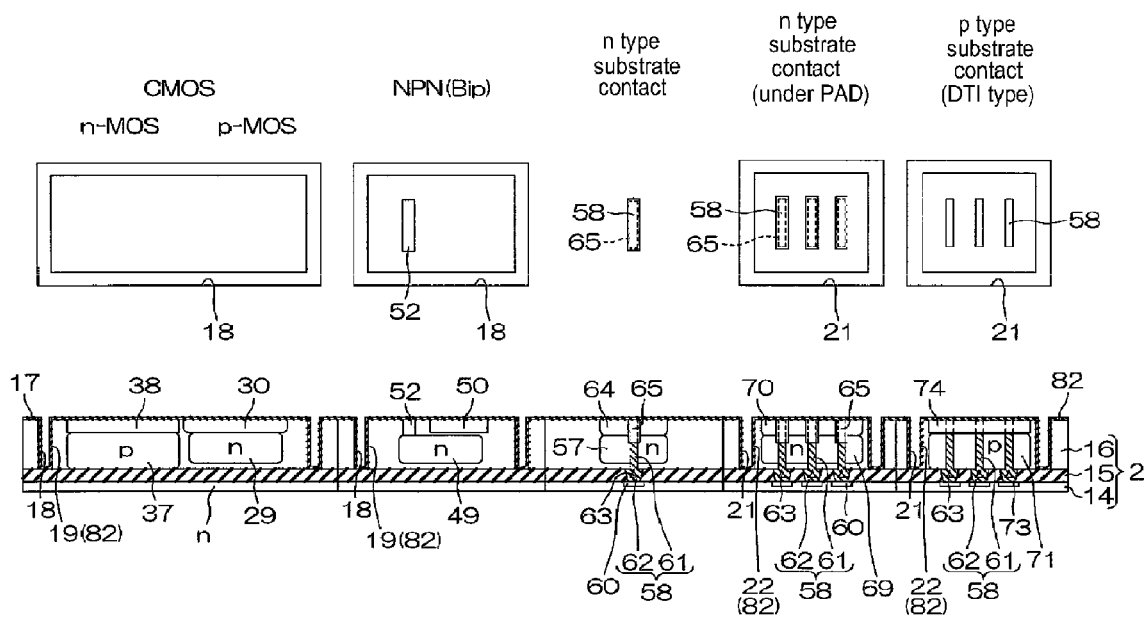

Next, as shown in FIG. 3K, the active layer 16 is thermally oxidized to form an insulation film 82 including the first trench thin film 19 and the second trench thin film 22 on the surface 17 of the active layer 16.

Figure 3L:
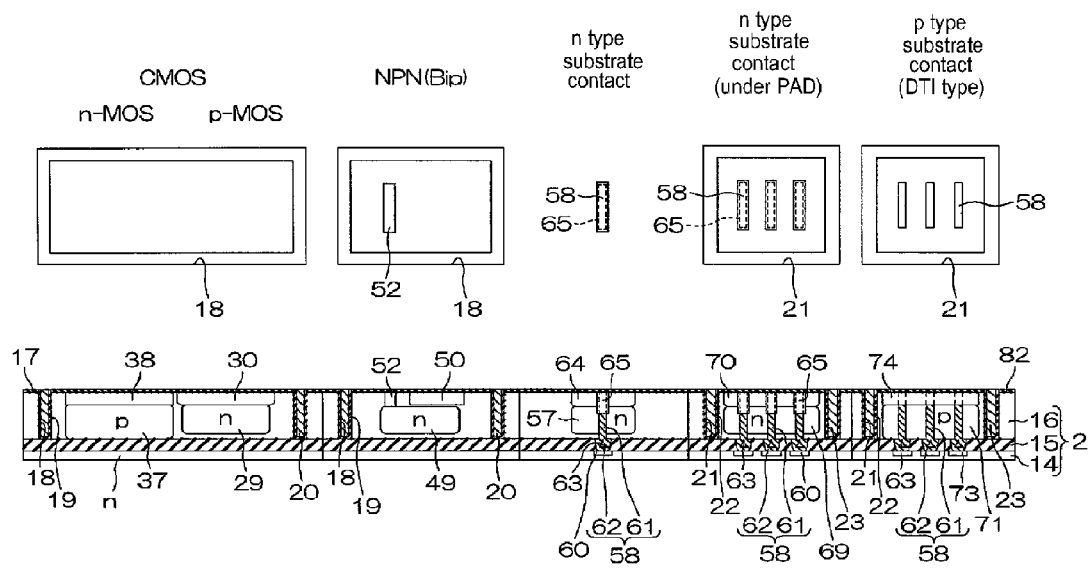

Next, as shown in FIG. 3L, polysilicon is embedded in the first deep trench 18 and the second deep trench 21 through CVD. Accordingly, the first polysilicon layer 20 and the second polysilicon layer 23 are formed, thereby simultaneously forming the element isolating portion 6 and the contact isolating portion 11. Thereafter, the insulation film 82 outside the first deep trench 18 and the second deep trench 21 is removed.

Figure 3M:
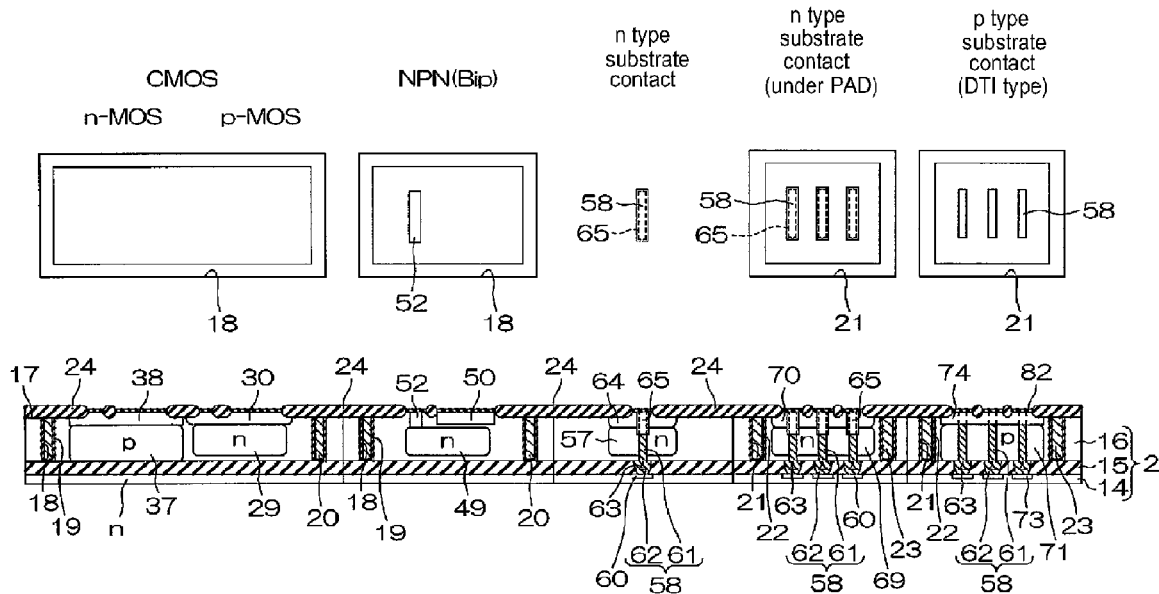
Figure 3N:
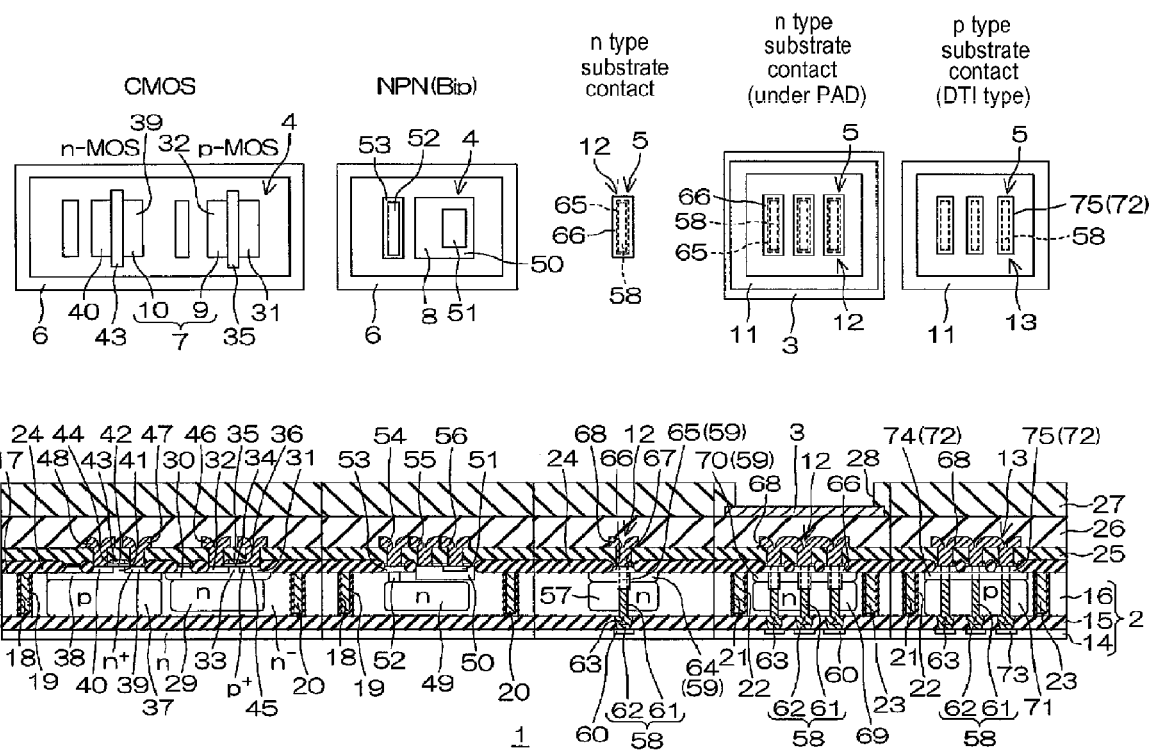

Next, as shown in FIG. 3M, the active layer 16 is thermally oxidized to form a field insulation film 24 on the surface 17 of the active layer 16.

Next, as shown in FIG. 3N, an n type impurity, e.g., arsenic (As) is selectively implanted into the element region 4 and the contact region 5. Subsequently, a p type impurity, e.g., boron (B) is selectively implanted into the element region 4 and the contact region 5. In addition, the implantation order of the n type impurity and the p type impurity may be interchanged.

Subsequently, the SOI substrate is thermally treated at, for example, 800 to 900 degrees C. to allow the n type impurity and the p type impurity to spread to the surface layer portion of the active layer 16. Accordingly, the p⁻ type source layer 32, the p⁻ type drain layer 31, the n⁻ type source layer 40, the n⁺ type drain layer 39, the n⁺ type potential extraction contact region 66, and the p⁺ type contact extraction layer 75 are simultaneously formed. Thereafter, a process of forming the first interlayer insulation film 25, each wiring, the second interlayer insulation film 26, the electrode pad 3, and the surface protective film 27, and the like can be executed to obtain the semiconductor device 1 illustrated in FIGS. 2A and 2B.

According to the semiconductor device 1, the ohmic-contact may be made between the through contact 58 of the n type substrate contact 12 and the Si substrate 14. Accordingly, the potential of the Si substrate 14 can be extracted at the surface 17 of the active layer through the n⁺ type lower implanted layer 60, the through contact 58, and the contact wiring 68. In this case, by maintaining the potential of the contact wiring 68 at a predetermined value, the potential of the Si substrate 14 may be fixed or a current may flow to the Si substrate 14.

Further, since the junction of the Si substrate 14 and the through contact 58 (polysilicon) is a junction between silicons (i.e., junction between homogeneous materials), a thermal expansion coefficient of the through contact 58 can be similar to that of the Si substrate 14. Thus, the through contact 58 and the Si substrate 14 can be thermally expanded and thermally contracted to an almost equal extent. Accordingly, an occurrence of a phenomenon, where only one of the through contact 58 and the Si substrate 14 is thermally expanded or thermally contracted and the other is damaged, can be prevented. In addition, an electro migration or an ion migration may be suppressed. Further, the through contact 58 can be prevented from being contaminated by heavy metal. As a result, the semiconductor device 1 having excellent reliability can be provided.

Moreover, like the through contact 58, the n type contact buried layers 57 and 69 may contribute to an electrical connection between the Si substrate 14 and the active layer 16. As a result, a sectional area (sectional area parallel with the surface 17 of the active layer 16) of a conductive path (n type substrate contact 12) between the Si substrate 14 and the active layer 16 can be increased. Thus, resistance of the corresponding conductive path can be lowered.

Further, the n type contact buried layers 57 and 69 are formed as the same layer as the B/L 29 and the collector layer 49, and these layers are simultaneously formed by selectively implanting an n type impurity into the element region 4 and the contact region 5 (process of FIG. 3B) and then epitaxially growing the active layer 16 to raise the surface of the active layer 16 (process of FIG. 3C). Thus, in the process of FIG. 3B, the regions of the n type contact buried layers 57 and 69 along the surface 17 of the active layer 16 can be simply increased by enlarging the implantation region of the n type impurity in the contact region 5. Accordingly, like the n type substrate contact 12 (in case in which it has the DTI type and is disposed under the pad), the n type contact buried layer 69 collectively surrounding the plurality of through contacts 58 can be simply formed.

When comparing to a conventional method, in which an impurity region is formed in the SOI layer by implanting a dopant to the side of a hole for a substrate potential contact, the sectional area of the n type contact buried layers 57 and 69 can be increased. As a result, the resistance of the substrate contact can be further lowered.

Further, the n type contact exposing layer 59 surrounding the through contact 58, in addition to the n type contact buried layers 57 and 69, is formed. Accordingly, in the active layer 16, the area of the impurity layer that can be used as a conductive path between the Si substrate 14 and the active layer 16 can be increased, and thus, the resistance of the substrate contact can be further lowered.

In addition, in the process of FIG. 3C, the thickness of an upper portion of the n type contact buried layers 57 and 69 in the active layer 16 can be simply adjusted by controlling the amount of an epitaxial growth of the active layer 16. On this account, in forming the n type contact exposing layer 59, the n type contact exposing layer 59 can be individually controlled by adjusting the implantation depth of the n type impurity into the active layer 16 depending on the growth amount. Thus, impurity concentration of each of the n type contact buried layers 57 and 69 and the n type contact exposing layer 59 can be precisely controlled based on the characteristics of the n type substrate contact 12 intended to be obtained. As a result, a resistance value of each of the n type contact buried layers 57 and 69 and the n type contact exposing layer 59 which is changed depending on an increase or decrease of the impurity concentration can be precisely controlled.

Moreover, since the impurity layer (n type contact buried layers 57 and 69) close to the BOX layer 15 is formed through epitaxial growth and the impurity layer (n type contact exposing layer 59) close to the surface 17 of the active layer 16 is formed through impurity implantation, the impurity layers can be formed without omission in the thickness direction (vertical direction) of the active layer 16. Thus, although the through contact 58 is formed to have a high aspect ratio, the entire through contact 58 can be surrounded by the impurity layers. As a result, a large current can flow to the Si substrate 14, and thus, the present disclosure can be applicable to a vertical type device.

Further, in the semiconductor substrate 1, the contact region 5 can be disposed at various positions on the active layer 16. Also, when the contact region 5 is demarcated by the contact isolating portion 11, the contact region 5 can be electrically insulated from other portions of the active layer 16. Thus, no matter where the contact region 5 is disposed, the contact region 5 can be independent from other portions of the active layer 16 and the potential of the Si substrate 14 can be freely controlled.

Additionally, in the fabrication method of the semiconductor device 1, the process (FIGS. 3J to 3L) of forming the element isolating portion 6 and the contact isolating portion 11 is executed after the wet etching process of FIG. 3E to form the through contact 58. Thus, an etching solution that can be used for the wet etching can be prevented from being in contact with the first and second trench thin films 19 and 22. Accordingly, a change in the property of the first and second trench thin films 19 and 22 by the etching solution can be prevented.

Furthermore, in the p type substrate contact 13, a pn junction can be formed between the p⁺ type lower implanted layer 73 and the Si substrate 14 (n type) in the p type substrate contact 13. Accordingly, the p type substrate contact 13 can be used as a GND diode.

The present disclosure may also be further implemented in a different form. For example, the order of the substrate contact formation process (FIG. 3D), the trench separation formation process (FIG. 3K), and the LOCOS oxidation isolation (field insulation film) formation process (FIG. 3M) may be interchanged.

In addition, the thick SOI substrate 2 may be a combination of, for example, an n type Si substrate and a p⁻ type active layer, a p type Si substrate and an n⁻ type active layer, and a p type Si substrate and a p⁻ type active layer. When the Si substrate is a p type, the p⁺ type lower implanted layer may be formed on the Si substrate to form the ohmic contact between the substrate contact and the Si substrate, and an n' type lower implanted layer may be formed on the Si substrate to form a pn junction between the corresponding n+ type lower implanted layer and the Si substrate (p type).

Further, the through contact 58 may not be necessarily polysilicon, and may be, for example, metal such as tungsten (W) or the like. Also, in case of polysilicon, an impurity need not be doped.

Additionally, a planar shape of the n type substrate contact 12 and the p type substrate contact 13 may not be necessarily a rectangular shape, and it may be, for example, a square shape, a circular shape, a lattice shape, or the like. In this case, the width of the trench constituting the above shape may be a certain width in consideration of a margin in terms of processing.

Moreover, the layout of the element region 4 and the contact region 5 may be appropriately changed, without being limited to the illustration of FIG. 1.

The semiconductor device according to the present disclosure may be applied to a power module (high voltage purpose) that can be used as an inverter circuit constituting a driving circuit for driving an electric motor used as a power source of, for example, an electric vehicle (including a hybrid car), an electric railroad, an industrial robot, or the like. In addition, it can also be applied to a power module that can be used as an inverter circuit for converting power generated by a solar cell, a wind turbine generator, and other generation devices (in particular, an independent power plant) such that it is adjusted with power of a commercial power source.

Various design modifications may be implemented within the scope of the claim coverage.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
    a semiconductor substrate including an active layer having a first conductive type in which an element region and a contact region are formed, a support substrate having a second conductive type and supporting the active layer, and a buried insulation layer interposed between the active layer and the support substrate to electrically insulate the active layer and the support substrate;
    a transistor element formed in the element region, the transistor element including a transistor buried impurity layer formed within the active layer and being spaced apart from a surface of the active layer; and
    a substrate contact including a contact buried impurity layer formed within the contact region and a through contact extending from the surface of the active layer to the support substrate through the contact buried impurity and the buried insulation layer, the contact buried impurity layer corresponding to the same layer as the transistor buried impurity layer.

2. The semiconductor device of claim 1, further comprising:
    a field insulation film formed on the surface of the active layer, the field insulation film including an opening for exposing a portion of the contact region,
    wherein a width of the contact buried impurity layer along the surface of the active layer is greater than a width of the opening of the field insulation film.

3. The semiconductor device of claim 1, wherein the transistor element further includes a transistor exposing impurity layer formed on the transistor buried impurity layer, and the transistor exposing impurity layer is formed a portion of the surface of the active layer, and
    wherein the substrate contact further includes a contact exposing impurity layer formed as the same layer as the transistor exposing impurity layer and the contact exposing impurity layer is disposed to be in contact with the through contact.

4. The semiconductor device of claim 1, wherein the transistor element includes a CMOS transistor having first and second transistors,
    wherein the first transistor includes a CMOS buried layer as the transistor buried impurity layer, and the first transistor has the same conductivity type as the first conductivity type of the active layer,
    the second transistor includes a CMOS isolation layer as the transistor buried impurity layer, and the second transistor has an opposite conductivity type to the first conductivity type of the active layer, and
    the contact buried impurity layer is formed as the same layer as at least one of the CMOS buried layer and the CMOS isolation layer.

5. The semiconductor device of claim 4, wherein the transistor element further includes a transistor exposing impurity layer formed on the transistor buried impurity layer, and the transistor exposing impurity layer forms a portion of the surface of the active layer, and
    the substrate contact further includes a contact exposing impurity layer, and the contact exposing impurity layer is formed as the same layer as the transistor exposing impurity layer and is disposed to be in contact with the through contact,
    wherein the first transistor includes a first well layer as the transistor exposing impurity layer having the same conductivity type as the first conductivity type of the active layer and disposed to be in contact with the CMOS buried layer, and
    the transistor exposing impurity layer includes a first source layer and a first drain layer and as has an opposite conductivity type to the first conductivity type of the active layer, and the first source layer and the first drain layer are formed to be spaced apart from each other in a surface layer portion of the first well layer,
    wherein the second transistor includes a second well layer as the transistor exposing impurity layer having the opposite conductivity type to the first conductivity type of the active layer and is disposed to be in contact with the CMOS isolation layer, and
    the transistor exposing impurity layer includes a second source layer and a second drain layer and has the same conductivity type as the first conductivity type of the active layer, and the second source layer and the second drain layer are formed to be spaced apart from each other in a surface layer portion of the second well layer, and
    wherein the contact exposing impurity layer is formed as the same layer as at least one of the first well layer, the second well layer, the first source layer, the first drain layer, the second source layer, and the second drain layer.

6. The semiconductor device of claim 1, wherein the transistor element includes a bipolar transistor,
the bipolar transistor includes a collector layer as the transistor buried impurity layer having the same conductivity type as the first conductivity type of the active layer, and
the contact buried impurity layer is formed as the same layer as the collector layer.

7. The semiconductor device of claim 6, wherein the transistor element further includes a transistor exposing impurity layer formed on the transistor buried impurity layer, and the transistor exposing impurity layer forms a portion of the surface of the active layer, and
the substrate contact further includes a contact exposing impurity layer, and the contact exposing impurity layer is formed as the same layer as the transistor exposing impurity layer and disposed to be in contact with the through contact,
wherein the bipolar transistor includes:
a base layer as the transistor exposing impurity layer having the opposite conductivity type to the first conductivity type of the active layer and formed to be spaced apart from the collector layer, and
an emitter layer as the transistor exposing impurity layer having the same conductivity type as the first conductivity type of the active layer and formed in a surface layer portion of the base layer, and
wherein the contact exposing impurity layer is formed as the same layer as at least one of the base layer and the emitter layer.

8. The semiconductor device of claim 7,
wherein the bipolar transistor further includes a sinker layer as the transistor exposing impurity layer, and the sinker layer has the same conductivity type to the first conductivity type of the active layer and extends from the surface of the active layer to reach the collector layer, and
wherein the contact exposing impurity layer includes a layer formed as the same layer as the sinker layer.

9. The semiconductor device of claim 1, wherein the element region is demarcated by an element isolating portion, and the element isolating portion is formed to have an annular shape surrounding the transistor element and insulates the element region from other portions of the active layer.

10. The semiconductor device of claim 9, wherein the element isolating portion includes a first annular deep trench extending from the surface of the active layer to reach the buried insulation layer, a first insulation film formed on an inner wall of the first deep trench, and a first semiconductor layer charged in the first deep trench.

11. The semiconductor device of claim 1, wherein the contact region includes an internal contact region installed within the element region.

12. The semiconductor device of claim 1, wherein the contact region includes an external contact region installed outside the element region.

13. The semiconductor device of claim 1, further comprising:
an interlayer insulation film formed on the semiconductor substrate; and
an electrode pad formed on the interlayer insulation film, wherein the substrate contact is installed under the electrode pad.

14. The semiconductor device of claim 1, wherein the contact region is demarcated by a contact isolating portion, and the contact isolating portion is formed to have an annular shape surrounding the substrate contact and extends from the surface of the active layer to reach the buried insulation layer.

15. The semiconductor device of claim 14, wherein the contact isolating portion includes a second annular deep trench extending from the surface of the active layer to reach the buried insulation layer, a second insulation film formed on an inner wall of the second deep trench, and a second semiconductor layer charged in the second deep trench.

16. The semiconductor device of claim 1, wherein the first and second conductivity types are the same conductivity type.

17. The semiconductor device of claim 1, wherein the first and second conductivity types are different conductivity types.

18. The semiconductor device of claim 1, wherein the substrate contact includes a lower implanted layer formed at a connection portion with the through contact in the support substrate.

19. The semiconductor device of claim 18, wherein the substrate contact includes a first substrate contact with the lower implanted layer having the same conductivity type as the second conductivity type of the support substrate.

20. The semiconductor device of claim 1, wherein the substrate contact includes a second substrate contact with a lower implanted layer having an opposite conductivity type to the second conductivity type of the support substrate.

21. The semiconductor device of claim 1, wherein the semiconductor substrate includes an SOI substrate in which the active layer and the support substrate are made of silicon and the buried insulation layer is made of a silicon oxide.

22. The semiconductor device of claim 1, wherein the through contact is made of polysilicon.

23. A method for fabricating a semiconductor device, comprising:
preparing a semiconductor substrate including an active layer with a first conductive type in which an element region and a contact region are formed, a support substrate with a second conductive type supporting the active layer, and a buried insulation layer interposed between the active layer and the support substrate to electrically insulate the active layer and the support substrate;
selectively implanting an impurity into the element region and the contact region from a surface of the active layer to simultaneously form a first impurity layer exposed from a surface of the element region and a second impurity layer exposed from a surface of the contact region;
epitaxially growing the active layer to raise the height of the surface of the active layer with respect to the buried insulation layer to form the first impurity layer as a transistor buried impurity layer spaced apart from the raised surface, and to simultaneously form the second impurity layer as a contact buried impurity layer spaced apart from the raised surface;
forming a transistor element having the transistor buried impurity layer in the element region; and
forming a trench extending from the surface of the active layer to the support substrate through the contact buried impurity and the buried insulation layer and embedding a through contact in contact with both of the active layer and the support substrate within the trench to form a substrate contact having the contact buried impurity layer and the through contact in the contact region.

24. The method of claim 23, further comprising:
forming a field insulation film on the surface of the active layer once the substrate contact is formed; and
forming an opening having a width smaller than a width of the contact buried impurity layer along the surface of the active layer in the field insulation film by removing a portion of the field insulation film in the contact region.

25. The method of claim 23, wherein said forming a transistor element further comprises forming a transistor exposing impurity layer to form a first portion of the surface of the active layer on the transistor buried impurity layer by selectively implanting a first impurity into the element region from the surface of the active layer once the transistor buried impurity layer is formed, and
wherein said forming a substrate contact further comprises forming a contact exposing impurity layer to form a second portion of the surface of the active layer on the contact buried impurity layer by selectively implanting a second impurity into the contact region simultaneously when implanting the first impurity into the element region.

26. The method of claim 23, wherein said forming a transistor buried impurity layer comprises:
forming a CMOS buried layer as the transistor buried impurity layer having the same conductivity type as the first conductivity type of the active layer, and
forming a CMOS isolation layer having an opposite conductivity type to the first conductivity type of the active layer, and
wherein said forming a transistor element comprises forming a CMOS transistor including a first transistor having the CMOS buried layer and a second transistor having the CMOS isolation layer, and
said forming a contact buried impurity layer is simultaneously performed with at least one of said forming a CMOS buried layer and said forming a CMOS isolation layer.

27. The method of claim 26, wherein said forming a transistor element further comprises forming a transistor exposing impurity layer to form a first portion of the surface of the active layer on the transistor buried impurity layer by selectively implanting a first impurity into the element region from the surface of the active layer once the transistor buried impurity layer is formed,
wherein said forming a substrate contact further comprises forming a contact exposing impurity layer to form a second portion of the surface of the active layer on the contact buried impurity layer by selectively implanting a second impurity into the contact region simultaneously when implanting the first impurity into the element region,
wherein said forming a transistor exposing impurity layer comprises:
forming a first well layer as the transistor exposing impurity layer having the same conductivity type as the first conductivity type of the active layer to be in contact with the CMOS buried layer;
forming a first source layer and a first drain layer having an opposite conductivity type to that of the active layer to be spaced apart from each other in a surface layer portion of the first well layer;
forming a second well layer having an opposite conductivity type to the first conductivity type of the active layer to be in contact with the surface of the CMOS isolation layer; and
forming a second source layer and a second drain layer having the same conductivity type as the first conductivity type of the active layer to be spaced apart from each other in a surface layer portion of the second well layer, and
wherein said forming a contact exposing impurity layer is simultaneously performed with at least one of said forming a first well layer, said forming a second well layer, said forming a first source layer, said forming a first drain layer, said forming a second source layer, and said forming a second drain layer.

28. The method of claim 23, wherein said forming a transistor buried impurity layer comprises forming a collector layer as the transistor buried impurity layer having the same conductivity type as the first conductivity type of the active layer,
said forming a transistor element comprises forming a bipolar transistor having the collector layer, and
said forming a contact buried impurity layer is simultaneously performed with said forming a collector layer.

29. The method of claim 28, wherein said forming a transistor element further comprises forming a transistor exposing impurity layer to form a first portion of the surface of the active layer on the transistor buried impurity layer by selectively implanting a first impurity into the element region from the surface of the active layer once the transistor buried impurity layer is formed,
wherein said forming a substrate contact further comprises forming a contact exposing impurity layer to form a second portion of the surface of the active layer on the contact buried impurity layer by selectively implanting a second impurity into the contact region simultaneously when implanting the first impurity into the element region,
wherein said forming a transistor exposing impurity layer comprises:
forming a base layer as the transistor exposing impurity layer having an opposite conductivity type to the first conductivity type of the active layer to form a space between the base layer and the collector layer; and
forming an emitter layer having the same conductivity type as the first conductivity type of the active layer in a surface layer portion of the base layer,
wherein said forming a contact exposing impurity layer is simultaneously performed with at least one of said forming a base layer and said forming an emitter layer.

30. The method of claim 29,
wherein said forming a transistor exposing impurity layer comprises forming a sinker layer as the transistor exposing impurity layer having the same conductivity layer as the first conductivity type of the active layer, and the sinker layer extends from the surface of the active layer to reach the collector layer, and
said forming a contact exposing impurity layer is simultaneously performed with said forming a sinker layer.

31. The method of claim 23, wherein said forming a trench comprises:
forming a half trench extending from the surface of the active layer to the buried insulation layer through dry etching; and
removing the buried insulation layer forming a bottom wall of the half trench through wet etching.

32. The method of claim 23, further comprising:
forming a lower implanted layer on the support substrate by implanting an impurity into the bottom wall of the trench before the through contact is embedded once the trench reaching the support substrate is formed.

33. The method of claim 23, further comprising:
simultaneously forming an element isolating portion for insulating the element region from other portions of the active layer, and a contact isolating portion for insulating the contact region from other portions of the active layer once the trench reaching the support substrate is formed.

34. The method of claim 33, wherein said forming an element isolating portion and a contact isolating portion comprises:
forming annular deep trenches extending from the surface of the active layer to reach the buried insulation layer to surround each of the element region and the contact region;
forming an insulation film on an inner wall of each of the deep trenches; and
charging a semiconductor layer within each of the deep trenches.

* * * * *